(12) United States Patent
Sasaki

(10) Patent No.: US 10,205,285 B2
(45) Date of Patent: Feb. 12, 2019

(54) CONNECTOR MODULE AND VEHICLE-MOUNTED CAMERA USING SUCH MODULE

(71) Applicant: HOSIDEN CORPORATION, Osaka (JP)

(72) Inventor: Daisuke Sasaki, Osaka (JP)

(73) Assignee: Hosiden Corporation, Osaka (JP)

( * ) Notice: Subject to any disclaimer, the term of this patent is extended or adjusted under 35 U.S.C. 154(b) by 0 days.

(21) Appl. No.: 15/634,446

(22) Filed: Jun. 27, 2017

(65) Prior Publication Data

US 2018/0006407 A1 Jan. 4, 2018

(30) Foreign Application Priority Data

Jul. 1, 2016 (JP) .................................. 2016-131813

(51) Int. Cl.
| | |
|---|---|
| *H01R 13/6581* | (2011.01) |
| *H01R 13/52* | (2006.01) |
| *H01R 13/62* | (2006.01) |
| *H01R 13/6596* | (2011.01) |
| *H01R 24/40* | (2011.01) |

(Continued)

(52) U.S. Cl.
CPC ........... *H01R 13/6581* (2013.01); *B60R 1/00* (2013.01); *H01R 13/5202* (2013.01); *H01R 13/62* (2013.01); *H01R 13/6596* (2013.01); *H01R 24/40* (2013.01); *H01R 24/52* (2013.01); *H04N 5/2257* (2013.01); *H05K 9/0007* (2013.01); *B60R 2300/40* (2013.01); *H01R 13/521* (2013.01); *H01R 13/743* (2013.01); *H01R 2103/00* (2013.01)

(58) Field of Classification Search
CPC ............ H01R 13/6581; H01R 13/5202; H01R 13/62; H01R 24/40; B60R 1/00; B60R 2300/40; H04N 5/2257; H05K 9/0007
See application file for complete search history.

(56) References Cited

U.S. PATENT DOCUMENTS

| | | | |
|---|---|---|---|
| 2011/0025850 A1 | 2/2011 | Maekawa et al. | |
| 2011/0096524 A1 | 4/2011 | Kameyama | |

(Continued)

FOREIGN PATENT DOCUMENTS

| | | |
|---|---|---|
| DE | 102014117648 A1 | 6/2016 |
| EP | 2284961 A1 | 2/2011 |

(Continued)

OTHER PUBLICATIONS

European Search Report dated Oct. 4, 2017.

*Primary Examiner* — Christopher K Peterson
(74) *Attorney, Agent, or Firm* — Dilworth & Barrese, LLP

(57) ABSTRACT

Provided is a connector module providing superior shielding performance with small number of components. The connector module includes a terminal module having a center conductor, a tubular insulator holder supporting the center conductor and a tubular conductive shell, and a shield case. A bottom portion of the shield case includes a protruding portion bent from an edge of an opening portion through which the terminal module extends and protruding in a cylindrical form. The terminal module is joined to the shield case with an outer circumferential face of the conductive shell and an inner circumferential face of the protruding portion being placed in face contact with each other.

8 Claims, 9 Drawing Sheets

(51) Int. Cl.
*H01R 24/52* (2011.01)
*H04N 5/225* (2006.01)
*H05K 9/00* (2006.01)
*B60R 1/00* (2006.01)
*H01R 13/74* (2006.01)
*H01R 13/00* (2006.01)
*H01R 103/00* (2006.01)

(56) References Cited

U.S. PATENT DOCUMENTS

| | | |
|---|---|---|
| 2012/0244744 A1 | 9/2012 | Huang |
| 2015/0029337 A1 | 1/2015 | Uchiyama et al. |
| 2015/0109183 A1 | 4/2015 | Smith |
| 2015/0222795 A1* | 8/2015 | Sauer ............... H04N 5/2257 348/148 |
| 2015/0280373 A1* | 10/2015 | Furukawa ............ H01R 13/46 439/578 |
| 2017/0271819 A1 | 9/2017 | Hehir et al. |

FOREIGN PATENT DOCUMENTS

| | | |
|---|---|---|
| EP | 2833489 A2 | 4/2015 |
| EP | 2993737 A1 | 3/2016 |
| JP | 2015-210292 A | 11/2015 |

* cited by examiner

Fig.9
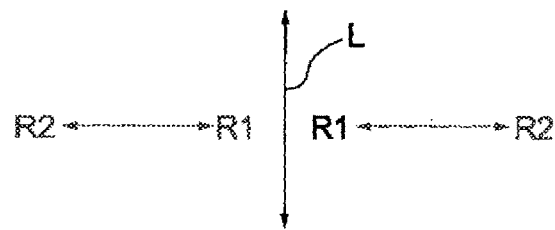
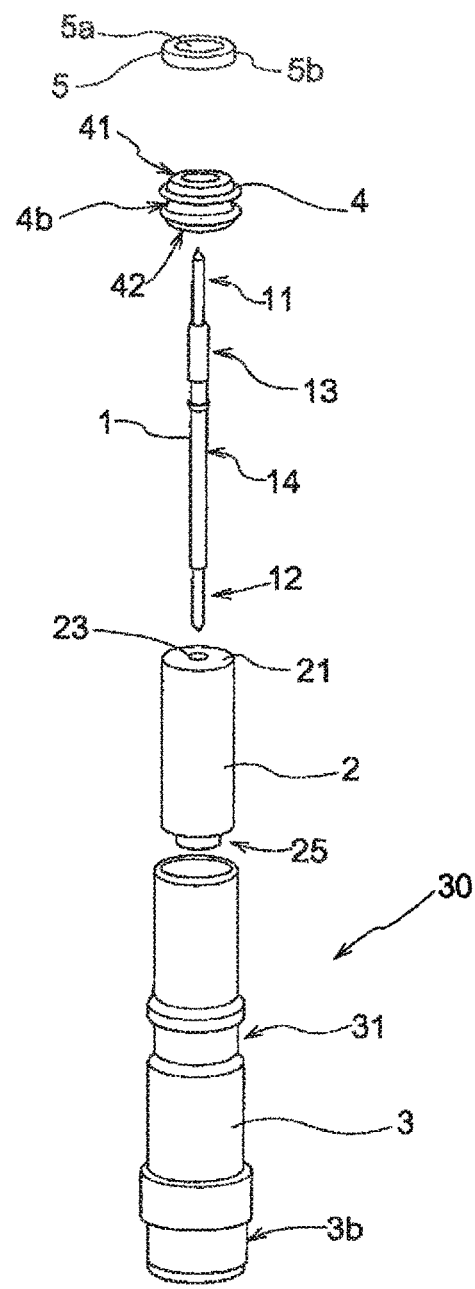

CONNECTOR MODULE AND VEHICLE-MOUNTED CAMERA USING SUCH MODULE

CROSS REFERENCE TO RELATED APPLICATION

This application is based on and claims priority under 35 U.S.C. Section 119 to Japanese Patent Application No. 2016-131813 filed on Jul. 1, 2016, the entire contents of which are incorporated herein by reference.

TECHNICAL FIELD

This disclosure relates to a connector module having a shield case and relates also to a vehicle-mounted camera using such module.

RELATED ART

Japanese Unexamined Patent Application Publication Hei. 2015-210292 discloses a connector unit ("plug (17)") for use in connecting a coaxial cable to a receptacle (25) provided in an electronic circuit unit (15) (the numerals within the parentheses are given in JP2015-210292A). Here, the coaxial cable is a type of cable including an inner conductor, an outer conductor covering the circumference of the inner conductor for its shielding against electromagnetic noise, and a dielectric (insulator) disposed between the inner conductor and the outer conductor.

The plug (17) includes an inner contact (17c) to be connected to the inner conductor of the coaxial cable, an outer contact (17a) to be connected to the outer conductor of the coaxial cable, and a shell (17b). The electronic circuit unit (15) includes a shield case (19) for shielding the circuit against electromagnetic noise. The receptacle (25) provided in the electronic circuit unit (15) has a connecting terminal (16) to be connected to the ground of the circuit. The outer contact (17a) of the plug (17) is connected to the connecting terminal (16) of the receptacle (25) and electrically connected to the ground of the electronic circuit unit (15). The shell (17b) of the plug (17) is placed in contact at a predetermined contact pressure with the shield case (19), thus being electrically conducted therewith, via a wave washer (31). Namely, shielding performance is improved by connecting the shield case (19) to the ground. Further, the wave washer (31) provides an additional function of enhancing the shielding performance on the outside of the shield case (19) by closing a through hole (19h) defined therein for allowing insertion of the terminal of the receptacle (25) therethrough (see JP 2015-210292A: FIGS. 1 through 7, [0049], [0050], etc.).

SUMMARY

The technique disclosed in JP2015-210292A allows improvement of shielding performance in connecting a coaxial cable to an electronic circuit unit. However, as the use of the wave washer (31) results in increase in the number of components, the technique may invite increase of product cost and/or manufacturing cost.

Further, as the wave washer (31) is not completely flat, it cannot close the through hole (19h) completely, so that a gap may be formed to invite deterioration in the shielding performance. In FIG. 8 in JP2015-210292A, there is proposed an arrangement omitting the wave washer (31), in which a plate spring arrangement is formed by forming a slit (19w) or an arm portion (19v) in the shield case (19) per se. In the case of this arrangement too, there is the possibility of shielding effect deterioration due to formation of a gap by the presence of the slit (19w).

In view of the above-described state of the art, there is a need for providing a connector module providing superior shielding performance with small number of components.

According to a connector module contemplated in view of the above above, the connector module comprises:
a terminal module including;
a linear-shaped center conductor for signal transmission,
a tubular insulator holder having a through hole at a center thereof for allowing insertion of the center conductor therethrough, the holder being configured to cover a center portion of the center conductor with respect to its extending direction and to hold the center conductor, and
a tubular conductive shell configured to cover a radial outer side of the insulator holder;
a shield case provided as a bottomed tubular conductive case and configured to shield an inner space of the case against electromagnetic wave propagated in an outer space of the case; and
a non-conductive connector case having a cylindrical space enclosing the terminal module and housing the terminal module and the shield case;
the shield case including a bottom portion extending perpendicular to a first direction along the extending direction of the center conductor and a side wall portion bent from a circumference of the bottom portion and extending along the first direction;
the bottom portion including an opening portion through which the terminal module extends and a protruding portion bent from an edge of the opening portion and protruding in a cylindrical form along the first direction; and
the terminal module being joined to the shield case with an outer circumferential face of the conductive shell and an inner circumferential face of the protruding portion being placed in face contact with each other.

With the above-described arrangement, the terminal module and the shield case are joined to each other without any component such as a wave washer, etc. present therebetween, in such a manner that an outer circumferential face of the conductive shell and an inner circumferential face of the protruding portion of the shield case are placed in face contact with each other. Namely, the arrangement allows to secure a larger contact area between the conductive shell and the shield case, so that favorable electrical connection can be realized with effective suppression of electric resistance at the bonding portion. Further, since the face contact allows suppression of formation of mechanical gap between the conductive shell and the shield case, favorable shielding performance too can be obtained. In this way, with the above-described arrangement, it is possible to realize a connector module providing superior shielding performance with small number of components.

In the above, preferably, an end portion of the conductive shell is press-fitted into an accommodating space formed on a radial inner side of the protruding portion.

If the conductive shell and the shield case are fixed to each other by way of such press-fitting, this can eliminate such steps as welding, bonding, soldering, etc., thus contributing to cost reduction of the connector module advantageously. When the end portion of the conductive shell is press-fitted into the accommodating space, the outer circumferential face of the conductive shell and the inner circumferential face of the protruding portion of the shield case are brought into face-contact with each other with a strong pressing force. Therefore, electric resistance of the bonding portion can be suppressed, whereby favorable electric connection can be realized. Further, since formation of mechanical gap between the conductive shell and the shield case can be suppressed also, favorable shielding effect can be obtained as well.

In the above, preferably:

an inner circumferential face of the connector case forming the cylindrical space includes an engaging pawl that protrudes on the radial inner side from the inner circumferential face and provides an elastic force along a radial direction;

an outer circumferential face of the conductive shell includes an engaging recessed portion in which the engaging pawl engages; and engagement between the engaging pawl and the engaging recessed portion restricts movement of the terminal module along the first direction relative to the connector case and retains the terminal module to the connector case.

With the above-described arrangement, as the engaging pawl is provided in the cylindrical space and the engaging recessed portion engageable with this engaging pawl is provided in the outer circumferential face of the conductive shell, the terminal module can be readily accommodated in and retained to the connector case.

Further preferably:

the terminal module includes an inner seal member formed as a toric member having an outer circumferential portion on a radial outer side thereof placed in pressure-contact with an inner circumferential face of the conductive shell and an inner circumferential portion on the radial inner side thereof placed in pressure-contact with the center conductor, thus sealing the inside of the terminal module;

the conductive shell includes an annular extending portion that extends annually from its inner circumferential face; and the inner seal member has one face thereof with respect to the first direction retained by the annular extending portion and the other face thereof with respect to the first direction retained by an end face of the insulator holder with respect to the first direction, whereby the inner seal member is set in position in the terminal module.

As such inner seal member is provided inside the terminal module, intrusion of liquid such as water droplets to the inside of the terminal module, e.g. to the center conductor, can be suppressed, whereby the environmental reliability of the connector module can be improved. Further, as this inner shield member is retained by being clamped by and between the annular extending portion and the insulator holder, there is no need to provide any special member for the purpose of retention of the inner seal member. Therefore, the above arrangement does not invite disadvantageous cost increase of the connector module, either.

Preferably:

the terminal module includes a retaining ring formed as a toric member having an outer circumferential portion on the radial outer side thereof placed in contact with the inner circumferential face of the conductive shell and an inner circumferential portion on the radial inner side thereof which has an inside diameter sized at least to allow extension therethrough of the center conductor; and the inner seal member and the insulator holder are disposed at a predetermined position with each other along the first direction as being bound between the annular extending portion and the retaining ring.

As the insulator holder is retained by the retaining ring, the inner seal member retained by this insulator holder is also retained. And, since this inner seal member is retained by the annular extending portion, too, the inner seal member and the insulator holder are retained to and bound between the annular extending portion and the retaining ring. Namely, only with using such retaining ring, the inner seal member and the insulator holder can be set at the predetermined position along the first direction, thus completing the terminal module. Therefore, with the above arrangement, the connector module can be configured in a favorable manner with small number of components.

Preferably:

the connector module includes an outer seal member formed as a toric member sealing the cylindrical space with an outer circumferential portion on a radial outer side thereof placed in pressure-contact with an inner circumferential face of the connector case which face forms the cylindrical space and an inner circumferential portion on the radial inner side thereof placed in pressure-contact with an outer circumferential face of the conductive shell; and the outer seal member is disposed on the side of the shield case with respect to the first direction.

As such outer seal member is provided in the cylindrical space of the connector case, intrusion of liquid such as water droplets to the inside of the connector module, e.g. to the terminal module, can be suppressed, whereby the environmental reliability of the connector module can be improved.

Preferably, the connector module is used for relaying between a coaxial cable and an electronic circuit, for instance. In general, a coaxial cable is fabricated to be confined within a controlled range of characteristic impedance. For appropriate signal transmission via the connector module, it is preferred that the characteristic impedance of the connector module too be managed appropriately.

Then, according to one aspect, preferably, the connector module has a predetermined characteristic impedance which is set based on an outside diameter of the center conductor, an inside diameter of the conductive shell and a relative dielectric constant of the insulator holder.

In recent years, for the sake of driving assistance or recording of traveling conditions, a camera is often mounted on a vehicle. Such camera is often installed on an exterior of the vehicle such as a dumper, a door, etc., whereas an image processing device and a monitoring device are often mounted inside the vehicle. Therefore, the image processing device, the monitoring device and the camera are connected to each other via cables or the like. Preferably, the above-described connector module is used in connection of such cables, thus constituting a vehicle-mounted camera.

According to one aspect, such vehicle-mounted camera comprises:

a camera module including;

an image pickup device, an electronic circuit configured to drive and control the image pickup device and also to process a video signal outputted from the image pickup device, and an optical unit having a lens for condensing light onto the image pickup device;

the connector module having any one of the above-described arrangements;

the center conductor being electrically connected to the electronic circuit; and at least a part of the electronic circuit being shielded by the shield case.

Further and other features and advantages of the connector module and the vehicle-mounted camera will become apparent upon reading the following description relating to some preferred non-limiting embodiments, with reference to the accompanying drawings.

BRIEF DESCRIPTION OF DRAWINGS

FIG. 9 is an exploded perspective view showing another example of terminal module.

DESCRIPTION OF EMBODIMENTS

Figure 1:
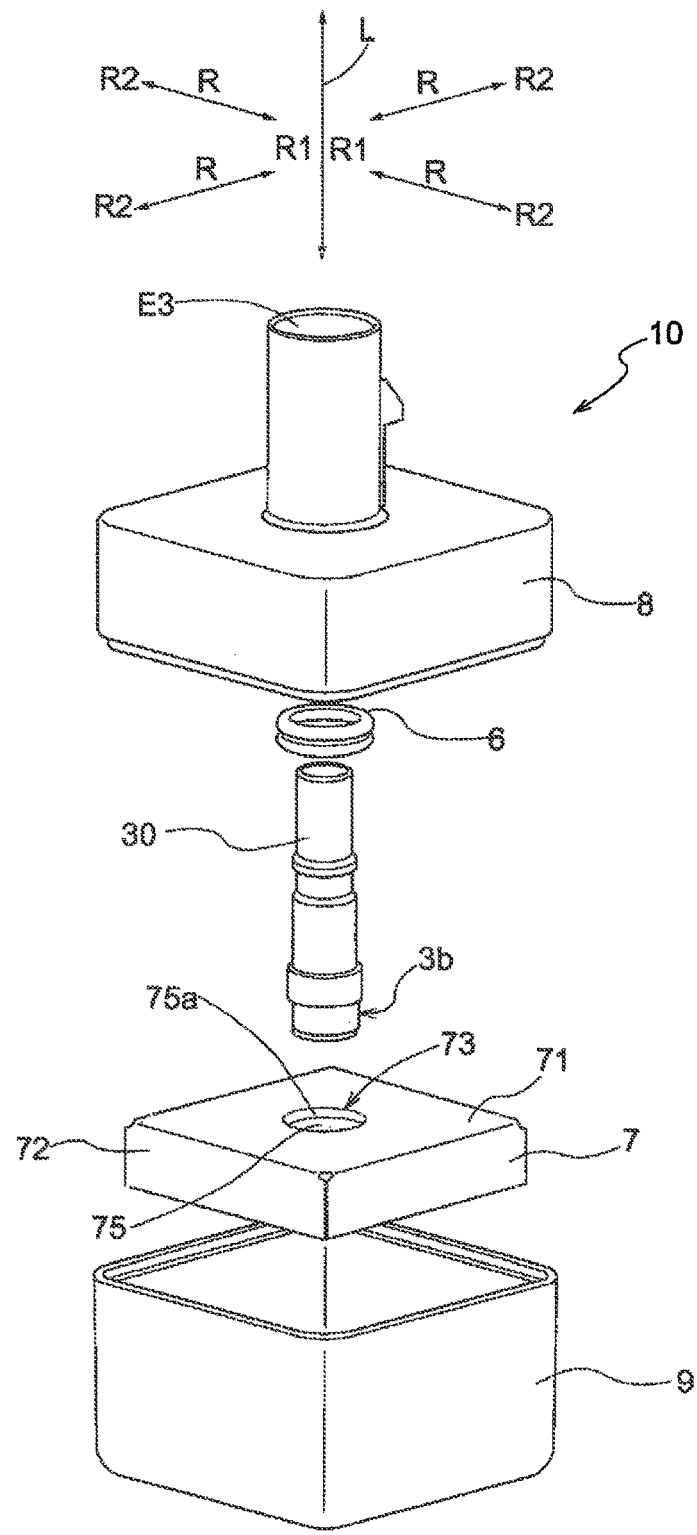
FIG. 1 is an exploded perspective view of a connector module.
Figure 2:
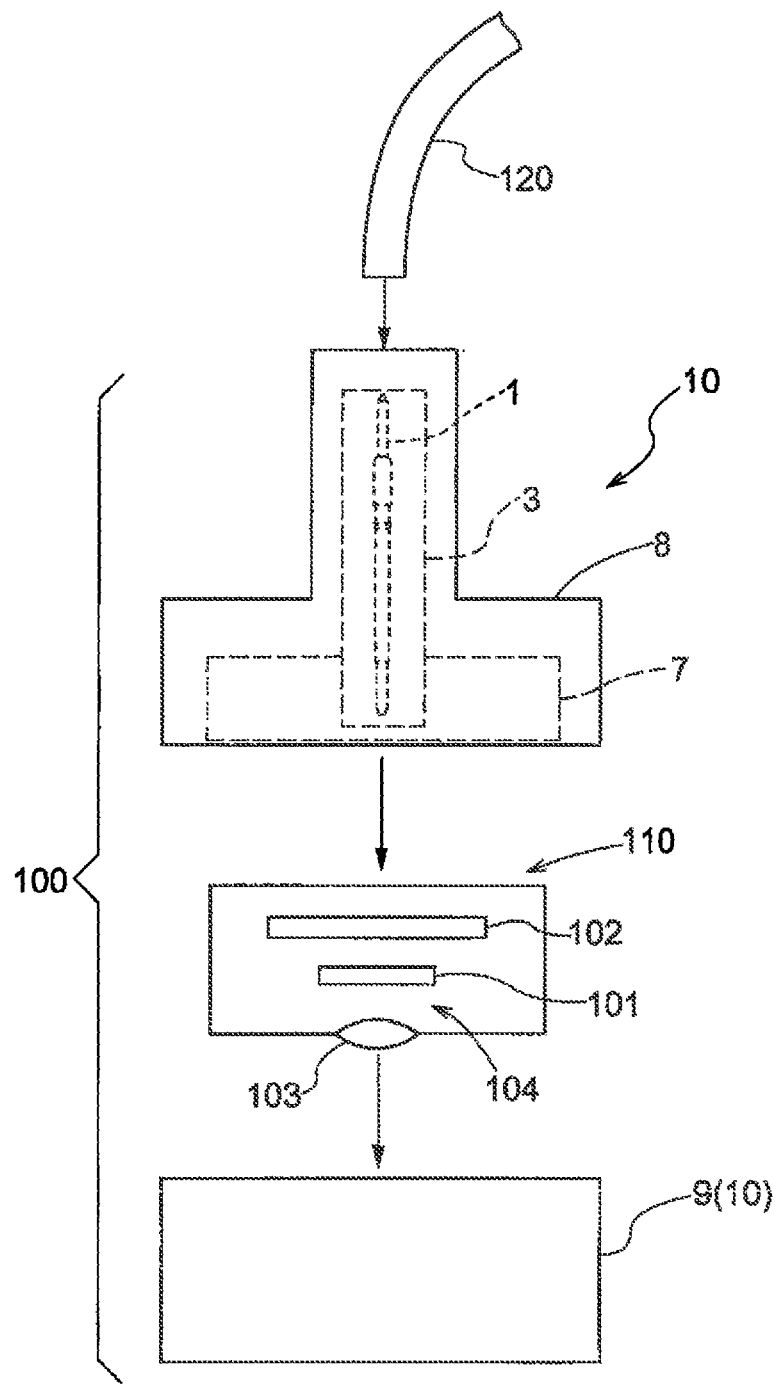
FIG. 2 is a view schematically showing an arrangement of a camera unit (vehicle-mounted camera)

Next, with reference to the drawings, an embodiment of a connector module 10 will be explained. FIG. 1 is an exploded perspective view of the connector module 10. In this embodiment, as schematically shown in FIG. 2, there will be explained by way of an example of the connector module 10 contemplated for use in a camera unit 100 (vehicle-mounted camera) to be mounted on a vehicle. Needless to say, the camera unit 100 can be used also in any other application than the application of vehicle mounting (e.g. can be mounted also on a bicycle, a drone, etc.). The camera unit 100 includes a camera module 110 and the connector module 10. The camera module 110 includes, at least, an image pickup device 101, an electronic circuit 102 for driving and controlling the image pickup device 101 and processing video signals outputted from the image pickup device 101, and an optical unit 104 having a lens 103 for condensing light onto the image pickup device 101.

The camera unit 100 is connected to an image processing device (not shown) or a monitoring device (not shown) via a coaxial cable 120. The coaxial cable 120 comprises a cable configured such that an inner conductor and an outer conductor are disposed coaxially across a dielectric (insulator) therebetween. The inner conductor transmits signals whereas the outer conductor acts as a shield for suppressing influence of electromagnetic wave to the inner conductor. In the instant embodiment, the inner conductor supplies electric power from the image processing device or the monitoring device to the image pickup device 101 or the electronic circuit 102 of the camera unit 100 and also outputs video signals outputted from the image pickup device 101 and the electronic circuit 102 to the image processing device or the monitoring device. Namely, the camera unit 100 is a photographic device using the known power line carrier system.

The image pickup device 101 of the camera module 110 comprises a CCD (Charge Coupled Device), a sensor or a CIS (CMOS Image Sensor). The lens 103 can be not only a single lens, but also multiple lenses. The electronic circuit 102 includes a clock driver for driving the image pickup device 101, and an analog signal processing circuit for effecting analog signal processing such as sample hold, clamp processing, on analog signals outputted from the image pickup device 101. The electronic circuit 102 can further include an A/D converter for converting analog signals to digital signals. The electronic circuit 102 can still further include a power circuit for effecting processing such as rectification on a power source supplied via the power line carrier system.

Incidentally, the electronic circuit 102 is configured as a circuit board in which electronic devices are mounted on a single or multiple printed boards. In the case of providing multiple circuit boards, a flexible board can be used for electric connection between the circuit boards. The circuit board on which the electronic circuit 102 is formed mounts also a receptacle (not shown) for connecting the coaxial cable 120. The connector module 10 is connected not only to the receptacle, but also to the coaxial cable 120, thus electrically connecting the electronic circuit 102 with the coaxial cable 120.

The connector module 10, as shown in the exploded perspective view in FIG. 1, includes a connector case 8, a terminal module 30, a shield case 7, a main body case 9, and an outer seal member 6. Further, the terminal module 30, as shown in the exploded perspective view in FIG. 3, includes a center conductor 1, an insulator holder 2, a conductive shell 3, an inner seal member 4 and a retaining ring 5. The terminal module 30 has a function which is electrically equivalent to that of the coaxial cable 120. Namely, the center conductor 1 corresponds to an inner conductor of the coaxial cable 120, the insulator holder 2 corresponds to the dielectric (insulator) of the coaxial cable 120, and the conductive shell 3 corresponds to the outer conductor of the coaxial cable 120. Preferably, the terminal module 30 is provided with a characteristic impedance equivalent to that of the coaxial cable 120. More particularly, for the connector module 10 (terminal module 30), there is set a predetermined characteristic impedance (e.g. 50Ω), based on an outside diameter (φ1) of the center conductor 1, an inside diameter (φ3) of the conductive shell 3, and a relative dielectric constant of the insulator holder 2. The characteristic impedance Zo is defined e.g. by a following expression (1), with the relative dielectric constant of the insulator holder being (ε).

$$Z_0 = \frac{60}{\sqrt{\varepsilon}} \log_e \frac{\phi 3}{\phi 1} \quad (1)$$

The connector case 8 is a case for accommodating the terminal module 30 and the shield case 7. In the camera unit 100, the connector case 8 is disposed rearwardly of the camera module 110, so this case 8 may sometimes be referred to as "rear case". The connector case 8 and the main body case 9, as being placed in contact with each other, together form therein an accommodating space for the terminal module 30, the shield case 7, and the camera module 110.

Figure 4:
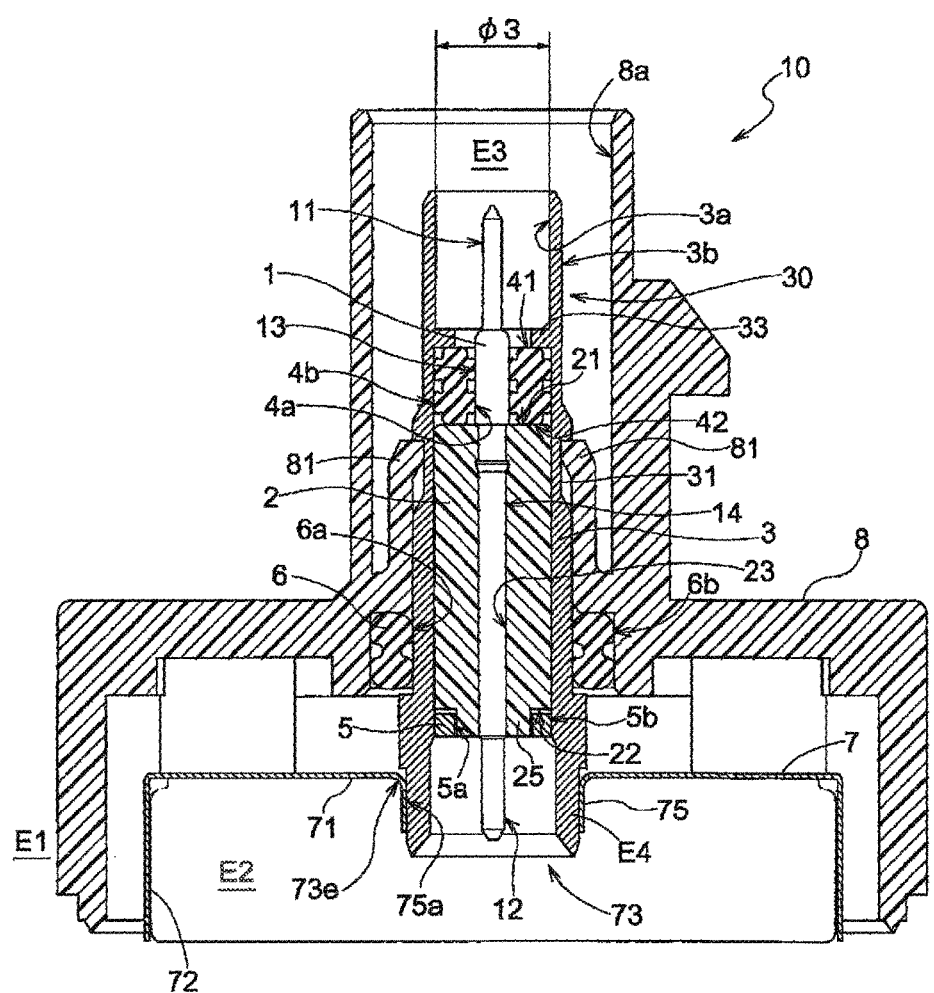
FIG. 4 is a vertical section of the connector module.

The shield case 7, as shown in the vertical section thereof shown in FIG. 4, shields an inner space E2 of the shield case 7 against electromagnetic wave which may be propagated from an outer space E1 of the shield case 7. Preferably, the shield case 7 covers at least a part of the electronic circuit 102 of the camera module 110, thus shielding the electronic circuit 102 against electromagnetic wave such as electromagnetic noise. Moreover, the shield case 7 can be connected to the ground (GND) of the electronic circuit 102. The outer conductor of the coaxial cable 120 is electrically connected to the conductive shell 3. Further, as will be explained later herein, the shield case 7 and the conductive shell 3 are electrically connected to each other. Therefore, in case the shield case 7 is connected to the ground of the electronic circuit 102, the conductive shell 3 and the outer conductor of the coaxial cable 120 are also electrically connected to the ground of the electronic circuit 102.

As described above, the camera unit 100 (vehicle-mounted camera) includes the camera module 110 having the image pickup device 101, the electronic circuit 102 for driving and controlling the image pickup device 101 and processing video signals outputted from the image pickup device 101 and the optical unit 104 having the lens 103 for condensing light onto the image pickup device 101, and the connector module 10. And, to the electronic circuit 102, the center conductor 1 is electrically connected and at least a part of the electronic circuit 102 is shielded by the shield case 7. Next, the connector module 10 will be described in greater details.

Figure 3:
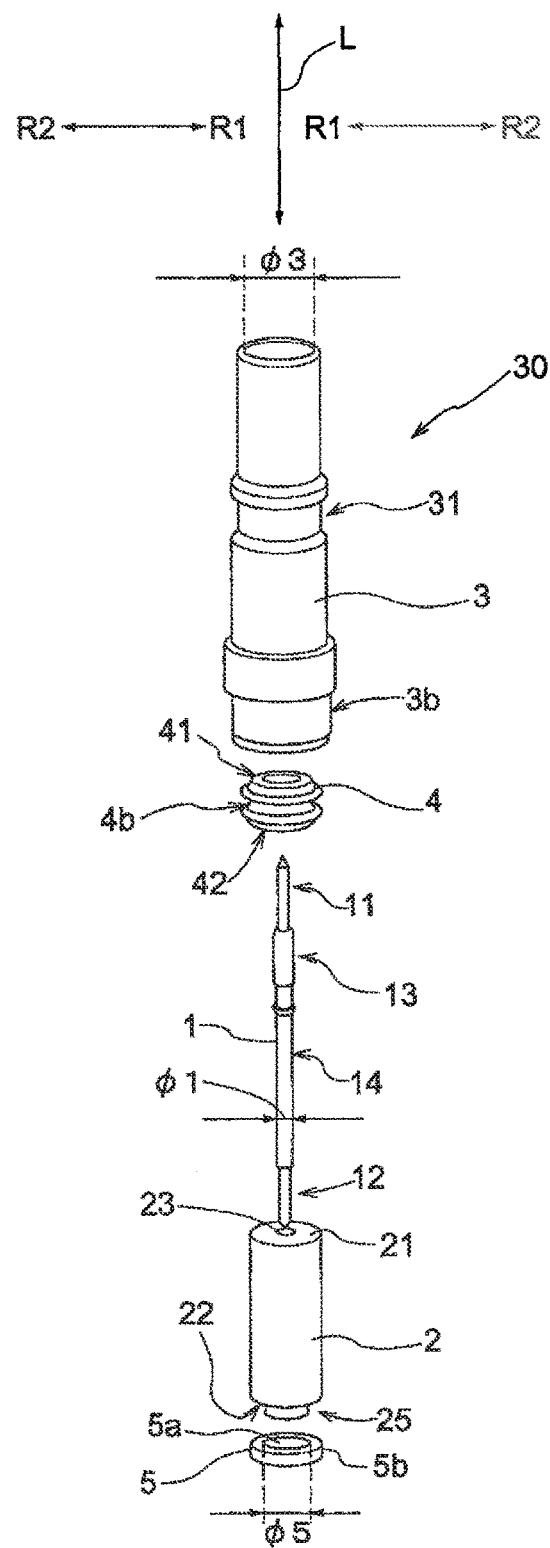
FIG. 3 is an exploded perspective view of a terminal module.

As shown in FIG. 1 and FIG. 4, the connector module 10 includes the connector case 8, the terminal module 30, the shield case 7, the main body case 9 and the outer seal member 6. As shown in FIG. 3 and FIG. 4, the terminal module 30 includes the center conductor 1, the insulator holder 2, the conductive shell 3, the inner seal member 4 and the retaining ring 5. The center conductor 1 is a linear-shaped conductor for signal transmission. In the instant embodiment, the center conductor 1 has a form of straight line and the extending direction of the center conductor 1 will be referred to as "a first direction L" hereinafter. Further, a direction perpendicular to the first direction L will be referred to as a radial direction R and one direction (side) of the radial direction R extending toward the center conductor 1 will be referred to as a radial inner side R1 and the other direction (side) of the radial direction R extending away from the center conductor 1 will be referred to as a radial outer side R2, respectively.

The insulator holder 2 comprises a cylindrical member with a thick wall formed of e.g. resin and having a through hole 23 (conductor through hole) for allowing insertion and extension of the center conductor 1 therethrough. The length of the insulator holder 2 in the first direction L is shorter than that of the center conductor 1. Therefore, the insulator holder 2 covers a center portion 14 (main line portion) of the center conductor 1 with respect to the first direction L (the extending direction of the center conductor 1) and supports this center conductor 1 (see FIG. 3 and FIG. 4). More particularly, the opposed ends (11, 12) of the center conductor 1 are not covered by the insulator holder 2, but exposed to form terminal portions. In the example shown in FIG. 3 and FIG. 4, the first terminal portion 11 is disposed on the side of the coaxial cable 120, and the second terminal portion 12 is disposed on the side of the camera module 110 (e.g. the side of the receptacle). Incidentally, the outside diameters of the center conductor 1 are set such that the outside diameter of the terminal portions (11, 12) is smaller than the outside diameter of the center portion 14 (the main line portion). The outside diameter ($\phi$1) of the center conductor 1 for defining the characteristic impedance Zo described above is the outside diameter of the center portion 14.

The conductive shell 3 comprises a cylindrical member configured to cover the radial outer side R2 of the insulator holder 2. Preferably, the conductive shell 3 is formed of metal. An inside diameter ($\phi$3) of the conductive shell 3 is one of the parameters for use in defining the characteristic impedance Zo, as described hereinbefore and the inner circumferential face 3a is formed substantially uniform. However, as will be described later with reference to FIG. 4, at a portion thereof, there is formed an annular extending portion 33 which extends annularly on the radial inner side R1 from the inner circumferential face 3a.

Figure 5:
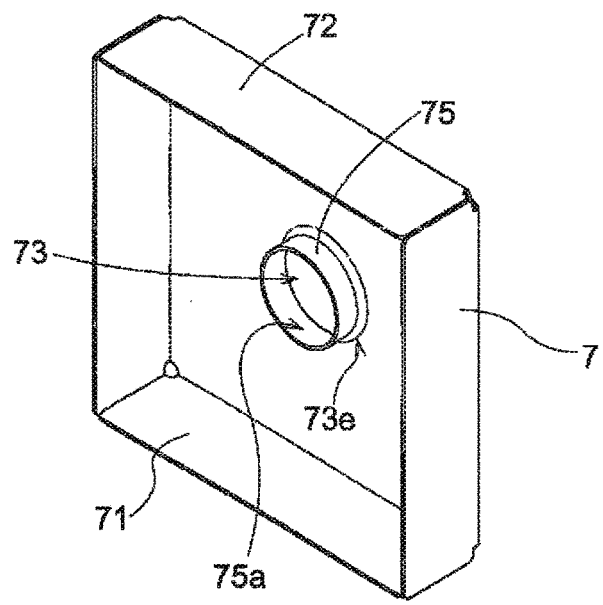
FIG. 5 is a perspective view of a shield case.

The shield case 7, in this embodiment, is a rectangular-shaped bottomed tubular case. The shield case 7 shields the inner space E2 of the case 7 against electromagnetic wave present in an outer space E1 of the shield case 7, e.g. electromagnetic wave such as electromagnetic noise which may influence signals transmitted by the center conductor 1 or the electronic circuit 102 of the camera module 110. For this reason, the shield case 7 too is formed of a conductive material such as metal. The shield case 7 includes a bottom portion 71 extending perpendicular to the first direction L along the extending direction of the center conductor 1 and a side wall portion 72 bent from a circumference of the bottom portion 71 and extending along the first direction L (along the direction in the first direction L opposite the terminal module 30). Further, the bottom portion 71, as shown in FIG. 4 and FIG. 5, includes an opening portion 73 through which the terminal module 30 (conductive shell 3) extends and a protruding portion 75 bent from an edge of the opening portion 73 (an opening edge portion 73e) and protruding in a cylindrical form along the first direction L (along the extending direction of the side wall portion 72). As will be described later, at the protruding portion 75, the shield case 7 and the terminal module 30 (conductive shell 3) are joined to each other (see FIG. 6 and FIG. 7).

The connector case 8 is a case for accommodating the terminal module 30 and the shield case 7. The connector case 8 includes, on its inner face side, a cylindrical space E3 for enclosing the terminal module 30, a rectangular-shaped tubular space which is in substantial agreement with the inner space E2 of the shield case 7. The terminal module 30 is accommodated in the cylindrical space E3 and the shield case 7 is accommodated in the rectangular-shaped tubular space. As the shield case 7 is accommodated in the rectangular-shaped tubular space, this space becomes a shielded space (inner space E2) shielded against electromagnetic noise or the like. The outer face of the terminal module 30 constitutes the conductive shell 3 and the shield case 7 too has conductivity. Therefore, in order to insulate the conductive shell 3 and the shield case 7 from the outside of the connector module 10, the connector case 8 is formed of an insulating (non-conductive) material such as resin.

Figure 6:
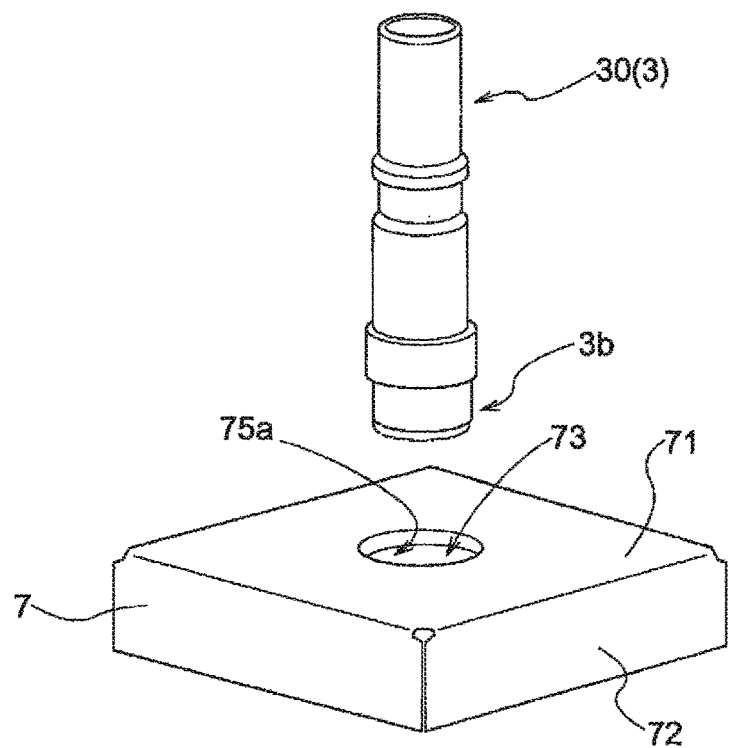
FIG. 6 is an exploded perspective view of a terminal module assembly.
Figure 7:
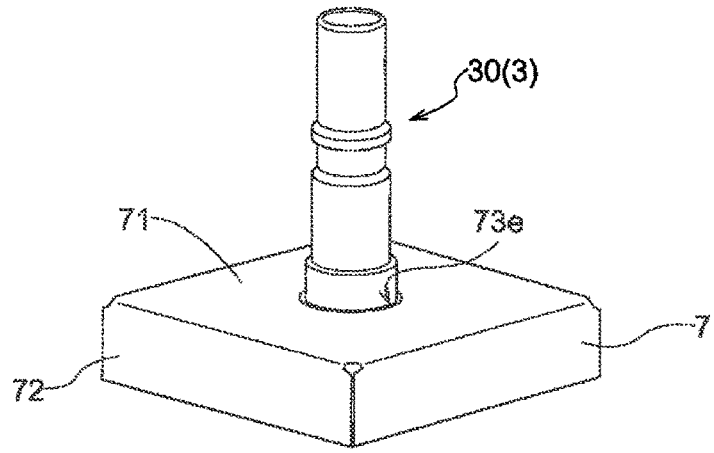
FIG. 7 is a perspective view of the terminal module assembly.

The connector case 8 accommodates the terminal module 30 and the shield case 7 as these terminal module 30 and shield case 7 are joined to each other. As shown in FIG. 4, FIG. 6 and FIG. 7, the terminal module 30 and the shield case 7 are joined to each other in such a manner that an outer circumferential face 3b of the conductive shell 3 and the inner circumferential face 75a of the protruding portion 75 are placed in face contact with each other. As the conductive shell 3 and the shield case 7 both are formed of conductive material such as metal, with the above-described bonding, the conductive shell 3 and the shield case 7 are connected electrically as well.

In this embodiment, an end portion of the conductive shell 3 is press-fitted into an accommodating space E4 (see FIG. 4) of the protruding portion 75, and an outer circumferential face 3b of the end portion of the conductive shell 3 and the inner circumferential face 75a of the protruding portion 75 are placed in pressure-contact with each other. Thus, the conductive shell 3 and the shield case 7 are joined to each other, without forming any gap at the edge portion (opening edge portion 73e; see FIG. 7) of the opening portion 73 in the bottom portion 71 of the shield case 7. This arrangement can appropriately suppress e.g. intrusion of magnetic wave from the outer space E1 to the inner space E2 of the shield case 7 or leakage of electromagnetic wave from the inner space E2 to the outer space E1 of the same. Incidentally, the joining between the conductive shell 3 and the shield case 7 is not limited to the pressure-fitting described above. Alternatively, the conductive shell 3 and the shield case 7 can be joined to each other by inserting the conductive shell 3 into the accommodating space E4 of the protruding portion 75 and then welding, adhering, or soldering the opening edge portion 73e.

Next, the arrangement of the terminal module 30 will be explained. As described above with reference to FIG. 3, etc., the terminal module 30 includes the center conductor 1, the insulator holder 2, the conductive shell 3, the inner seal member 4 and the retaining ring 5. The center conductor 1, the insulator holder 2 and the conductive shell 3 together provide the electrically equivalent function of a coaxial cable as described above. The inner seal member 4 seals against intrusion of liquid or the like into the terminal module 30 which functions as a coaxial cable.

The inner seal member 4 comprises a toric shaped member (elastic member) having elasticity. As shown in FIG. 4, an outer circumferential portion 4b on the radial outer side R2 of the inner seal member 4 is placed in pressure-contact with the inner circumferential face 3a of the conductive shell 3. Also, the inner circumferential portion 4a of the radial inner side R1 of the inner seal member 4 is placed in pressure-contact with the center conductor 1. The inner circumferential portion 4a of the inner seal member 4 is placed in pressure-contact with the center conductor 1 at a bulging portion 13 of the center conductor 1 which portion has a greater outside diameter than the remaining portion thereof. As the inner seal member 4 is an elastic member, this inner seal member 4 is elastically deformed according to the outside diameter of the center conductor 1, thus being placed in pressure-contact with the center conductor 1.

As shown in FIG. 4, the conductive shell 3 has the annular extending portion 33 extending annularly from the inner circumferential face 3a. The inner seal member 4 is set in the terminal module 30, with one side face (first face 41) thereof with respect to the first direction L being retained by the annular extending portion 33 and the other side face (second face 42) thereof being retained by the end face (first face 21) of the insulator holder 2 with respect to the first direction L.

The retaining ring 5 cooperates with the annular extending portion 33 to clamp the inner seal member 4 and the insulator holder 2 between the retaining ring 5 and the annular extending portion 33, thus fixing these in position inside the conductive shell 3 with respect to the first direction L. The retaining ring 5 is a toric member and defines a through hole at the center portion thereof. The inside diameter ($\phi$5) of this through hole is sized to allow at least insertion and extension of the center conductor 1 therethrough. In the instant embodiment, a retaining portion 25 that protrudes in the first direction L from the second face 22 of the insulator holder 2 is inserted into the through hole of the retaining ring 5 and an inner circumferential portion 5a of the retaining ring 5 is placed in contact with the insulator holder 2 (retaining portion 25). Therefore, in the instant embodiment, the inside diameter ($\phi$5) of the through hole is sized to allow insertion/extension of the retaining portion 25 (for instance, the outside diameter of the retaining portion 25 is equal to or smaller than the inside diameter ($\phi$5) of the through hole). Incidentally, in case the material forming the insulator holder 2 is an elastic material, the outside diameter of the retaining portion 25 can be made greater than the inside diameter ($\phi$5) of the through hole. Further, since the center conductor 1 extends through the center of the retaining portion 25, the outside diameter of the retaining portion 25 is greater than the outside diameter ($\phi$1) of the center conductor 1.

The retaining ring 5 is fixed to the conductive shell 3 with the outer circumferential portion 5b on the radial outer side R2 thereof being placed in contact with the inner circumferential face 3a of the conductive shell 3. For instance, the retaining ring 5 and the conductive shell 3 can be fixed to each other by engaging by press-fitting the retaining ring 5 to the conductive shell 3. Needless to say, the conductive shell 3 and the retaining ring 5 can be fixed by welding, adhesion, etc. also.

As described above, the conductive shell 3 has the annular extending portion 33 that extends annularly from the inner circumferential face 3a. The terminal module 30 is formed by placing the inner seal member 4 in contact with the annular extending portion 33, placing the insulator holder 2 supporting the center conductor 1 in contact with the inner seal member 4 and placing the retaining ring 5 in contact with the insulator holder 2. In other words, in the terminal module 30, the inner seal member 4 and the insulator holder 2 are disposed at a predetermined position to each other with respect to the first direction L, as being clamped between the annular extending portion 33 and the retaining ring 5.

The terminal module 30 formed as described above is then joined to the shield case 7 in the manner described above. An intermediate assembled article including the terminal module 30 and the shield case 7 joined to each other will be referred to a 'terminal module assembly' for the sake of convenience of explanation. This terminal module assembly is attached to the connector case 8. As described hereinbefore, the connector case 8 has, on the inner face side thereof, the cylindrical space E3 which encloses the terminal module 30 and the rectangular-shaped tubular space which is in substantial agreement with the inner space E2 of the shield case 7. The terminal module 30 is accommodated in the cylindrical space E3 and the shield case 7 is accommodated in the rectangular-shaped tubular space.

By inserting, along the first direction L, the terminal module 30 side of the terminal module assembly from the rectangular-shaped tubular space toward the cylindrical space E3 of the connector case 8, the terminal module assembly can be accommodated in the connector case 8. In the course of this, in order to suppress intrusion of liquid into the cylindrical space E3 of the connector case 8, preferably, a seal member (outer seal member 6) is attached in the cylindrical space E3. In the instant embodiment, this outer seal member 6 is disposed on the shield case 7 side with respect to the first direction L. This outer seal member 6 too, like the inner seal member 4, is a toric member having elasticity (elastic member). An outer circumferential portion 6b on the radial outer side R2 of the outer seal member 6 is placed in pressure-contact with the inner circumferential face 8a of the connector case 8 which face forms the cylindrical space E3. Also, an inner circumferential portion 6a on the radial inner side R1 of the outer seal member 6 is placed in pressure-contact with the outer circumferential face 3b of the conductive shell 3.

In case the connector modules 10 is used in the camera unit 100 as a vehicle-mounted camera as is the case with the instant embodiment, as described above, the sealing arrangements using the inner seal member 4 and/or the outer seal member 6 is effective and useful. The camera unit 100 as a vehicle-mounted camera is often utilized for driving assistance or recording traveling conditions as well. In such case, the camera unit 100 will often be mounted to an exterior of the vehicle body, such as a dumper, a door, etc. Such exterior of a vehicle body is often exposed to splash of water droplets from rain water, snow or puddles formed in the road, etc. Therefore, preferably, by providing the sealing arrangements described above, the connector module 10 can be provided with water-resistance.

The inner circumferential face 8a of the connector case 8 forming the cylindrical space E3 includes an engaging pawl 81 that protrudes on radial inner side R1 from the inner circumferential face 8a and provides an elastic force along the radial direction R. On the other hand, the outer circumferential face 3b of the conductive shell 3 includes an engaging recessed portion 31 in which the engaging pawl 81 engages. In operation, as the terminal module 30 side of the terminal module assembly is inserted from the rectangular-shaped tubular space toward the cylindrical space E3 of the connector case 8 along the first direction L, the engaging pawl 81 of the connector case 8 comes into engagement with the engaging recessed portion 31 of the conductive shell 3. This engagement between the engaging pawl 81 and the engaging recessed portion 31 restricts movement of the terminal module 30 along the first direction L relative to the connector case 8.

Further, under the above-described state, the bottom portion 71 of the shield case 7 also is contact with the connector case 8. Therefore, the terminal module assembly (terminal module 30) is retained to the connector case 8. Incidentally, in consideration to possible differences among the individual articles, manufacturing tolerance, etc., preferably, the respective components (in particular, the conductive shell 3 and the shield case 7) of the terminal module assembly can be formed with such tolerance that allows the bottom portion 71 of the shield case 7 to come into contact with the connector case 8 after establishment of engagement between the engaging pawl 81 and the engaging recessed portion 31.

The assembled article formed by accommodating the terminal module 30 and the shield case 7 in the connector case 8 and fixed thereto constitutes the connector module 10 in the narrow sense of the language. This narrowly defined connector module 10 can be referred to as the connector module 10 with addition of the main body case 9. In the case of including the main body case 9, there is possibility of the camera module 110 being accommodated in the main body case 9. In such case, the connector module 10 will be rendered substantially equivalent to the camera unit 100. Therefore, the assembled article having the terminal module 30 and the shield case 7 being accommodated in and fixed to the connector case 8, the intermediate assembled article including the main body case 9, and also the camera unit 100 accommodating the camera module 110 all can be caused to correspond to the connector module 10. In the instant embodiment, unless explicitly indicated otherwise, the article having the terminal module 30 and the shield case 7 being accommodated in and fixed to the connector case 8 will be referred to as the "connector module 10", in the following discussion.

Incidentally, here, there was shown an exemplary arrangement wherein the terminal module assembly is assembled with the connector case 8, thus assembling the connector module 10. However, the invention is not limited thereto. For instance, the connector assembly can be formed by assembling only the terminal module 30 with the connector case 8. And, the connector module 10 can be assembled by joining the conductive shell 3 of the connector case assembly with the shield case 7. Further alternatively, the connector module 10 can be assembled by assembling only the conductive shell 3 to the connector case 8 and then assembling the inner seal member 4, the insulator holder 2 retaining the center conductor 1 and the retaining ring 5 one after another in this mentioned order to this conductive shell 3 and then joining the shield case 7. In the above, there was shown the case wherein firstly the center conductor 1 is retained to the insulator holder 2. Instead, after the insulator holder 2 is inserted into the conductive shell 3, the center conductor 1 may be inserted into the through hole 23 of the insulator holder 2.

In this way, the connector module 10 can be assembled with small number of components, and by a small number of steps, without using a washer or the like. Namely, according to the instant embodiment, it is possible to realize the connector module 10 enabling connection between the coaxial cable 120 and the circuit (camera unit 100) and having only small number of components, but providing high shielding performance.

OTHER EMBODIMENTS

Next, other embodiments will be explained. Incidentally, arrangements of the following respective embodiments are not limited to those applied individually, but can be applied in any combination with arrangement(s) of other embodiment(s).

Figure 8:
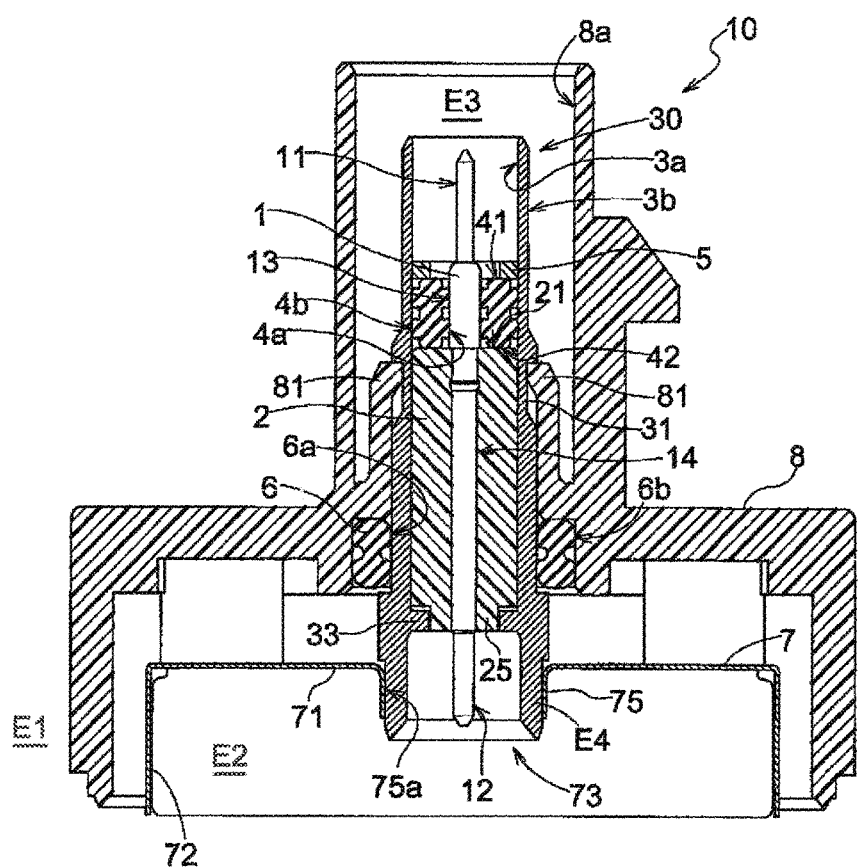
FIG. 8 is a vertical section showing another example of connector module.

(1) The disposing positions of the retaining ring 5 in the terminal module 30 and the annular extending portion 33 in the conductive shell 3 are not limited to those illustrated in FIG. 4, but can be reverse disposing arrangement as illustrated in FIG. 8. Incidentally, in the case of the arrangement illustrated in FIG. 8, the terminal module 30 will be assembled according to the exploded perspective view shown in FIG. 9, differently from the exploded perspective view shown in FIG. 3.

Figure 10:
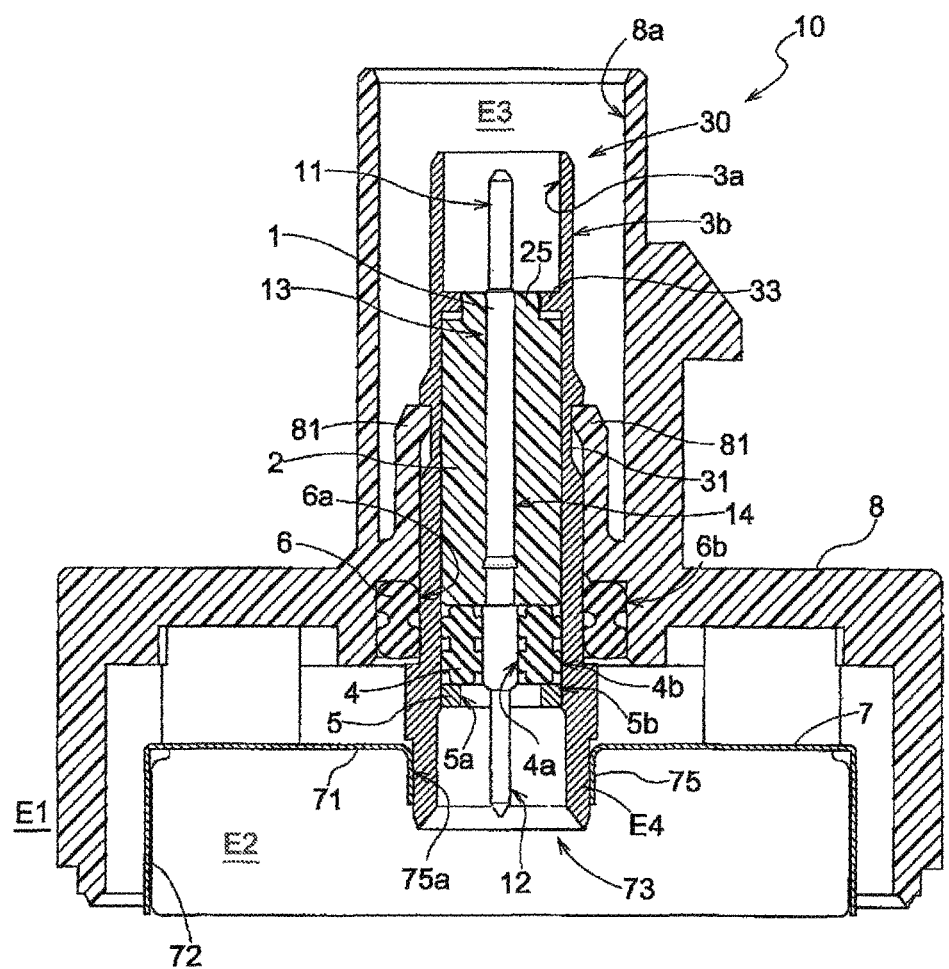
FIG. 10 is a vertical section showing another example of connector module.

(2) The disposing position of the inner seal member 4 in the terminal module 30 with respect to the first direction L is not limited to that illustrated in FIG. 4. In the case of the arrangement illustrated in FIG. 4, across the insulator holder 2, on the side opposite the shield case 7, the inner seal member 4 is disposed. However, as illustrated in FIG. 10, the inner seal member 4 can be disposed at a position between the insulator holder 2 and the shield case 7, that is, on the shield case 7 side relative to the insulator holder 2. Further, in the case of the arrangement illustrated in FIG. 10, the disposing position of the retaining ring 5 and the annular extending portion 33 is same as that illustrated in FIG. 4. However, it is needless to say that the disposing position of the retaining ring 5 and the annular extending portion 33 can be same as that illustrated in FIG. 8. In this detailed description, reference may not be made to all possible combinations. However, it is understood that unless contradiction occurs, combination with the arrangements of other embodiments as above will be possible.

Figure 11:
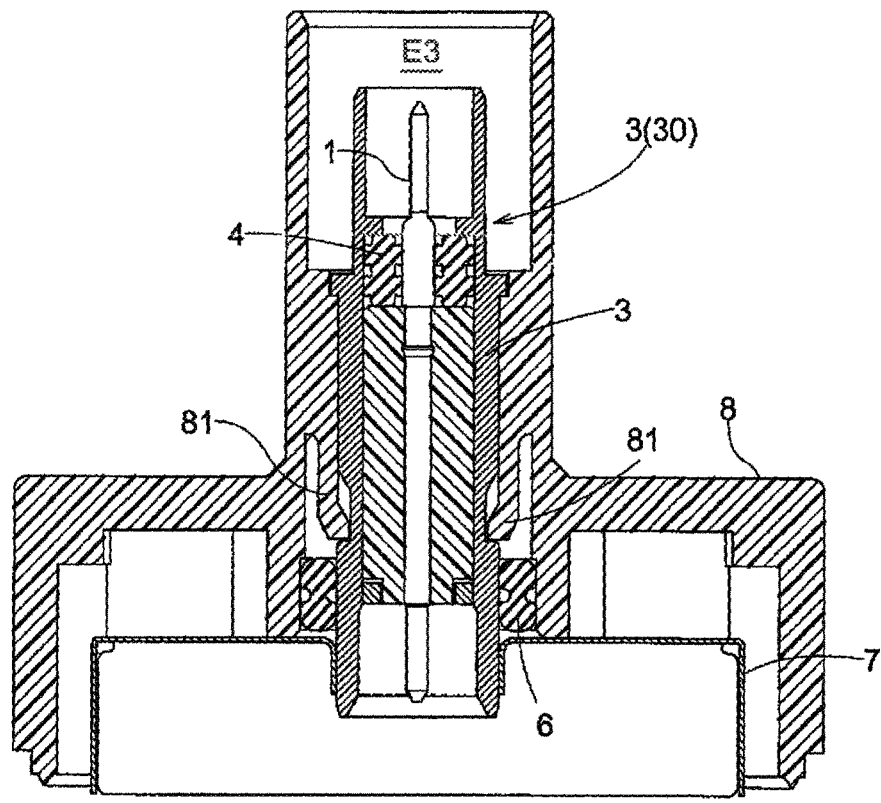
FIG. 11 is a vertical section showing another example of connector module.

(3) The engaging pawl 81 formed in the inner circumferential face 8a of the connector case 8 inside the cylindrical space E3 of the connector case 8 is not limited to the one extending upwards as shown in FIG. 4 (FIG. 8, FIG. 10). Alternatively, as illustrated in FIG. 11, it can extend downwards in the drawing. In such case, the terminal module 30 will need to be inserted into the cylindrical space E3 of the connector case 8 from the upper side to the lower side in the illustration. Therefore, it is preferred that the terminal module 30 is assembled to the connector case 8 before the shield case 7 and the terminal module 30 are joined to each other and then the shield case 7 is joined thereto. Or, the shield case 7 and the conductive shell 3 may be joined and assembled to the connector case 8, with using the same disposing position of the retaining ring 5 and the annular extending portion 33 as that shown in FIG. 8 and then, to the conductive shell 3 assembled to the connector case 8, the insulator holder 2, the center conductor 1, the inner seal member 4 and the retaining ring 5 can be assembled.

Figure 12:
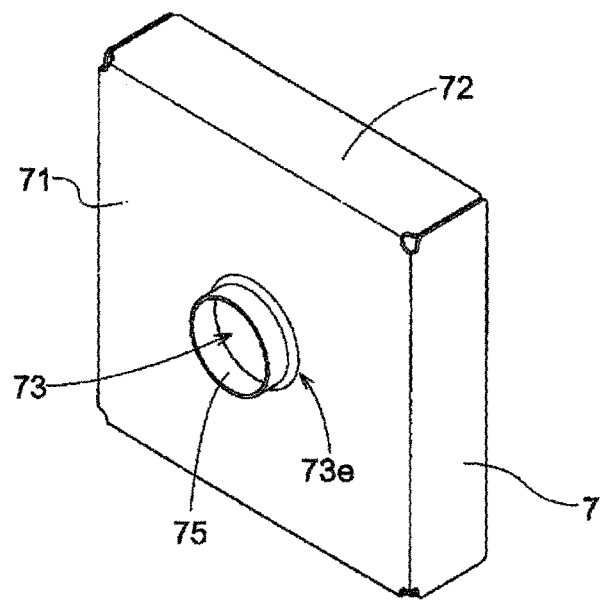
FIG. 12 is a perspective view showing another example of shield case.

(4) In the above, as described with reference to FIG. 4, FIG. 5, etc., there was shown the example in which the protruding portion 75 is bent from the edge (opening edge portion 73e) of the opening portion 73 and protrudes in the direction opposite to the terminal module 30. However, the protruding portion 75 can protrude in the opposite direction as long as it protrudes in the form of cylinder along the first direction L. Namely, as illustrated in FIG. 12, the protruding portion 75 may be bent from the opening edge portion 73e and protrude in the direction opposite to the side wall portion 72 (the direction opposite to the inner space E2 of the shield case 7, the direction of the terminal module 30).

The invention claimed is:

1. A connector module comprising:
a terminal module including;
a linear-shaped center conductor for signal transmission,
a tubular insulator holder having a through hole at a center thereof for allowing insertion of the center conductor therethrough, the holder being configured to cover a center portion of the center conductor with respect to its extending direction and to hold the center conductor, and
a tubular conductive shell configured to cover a radial outer side of the insulator holder;
a separate shield case provided as a bottomed tubular conductive case and configured to be both separate from the tubular conductive shell and electrically connected to the tubular conductive shell and cover a radial outer side of the tubular conductive shell and shield an inner space of the case against electromagnetic wave propagated in an outer space of the case; and
a non-conductive connector case having a cylindrical space enclosing the terminal module and housing the terminal module and the shield case;
the shield case including a bottom portion extending perpendicular to a first direction along the extending direction of the center conductor and a side wall portion bent from a circumference of the bottom portion and extending along the first direction;
the bottom portion including an opening portion through which the terminal module extends and a protruding portion bent from an edge of the opening portion and back toward the direction said side wall portion extends, to protrude in a cylindrical form along the first direction; and
the terminal module being joined to the shield case with an outer circumferential face of the conductive shell and an inner circumferential face of the protruding portion being placed in face contact with each other.

2. The connector module of claim 1, wherein an end portion of the conductive shell is press-fitted into an accommodating space formed on a radial inner side of the protruding portion.

3. The connector module of claim 1, wherein:
an inner circumferential face of the connector case forming the cylindrical space includes an engaging pawl that protrudes on the radial inner side from the inner circumferential face and provides an elastic force along a radial direction;
an outer circumferential face of the conductive shell includes an engaging recessed portion in which the engaging pawl engages; and
engagement between the engaging pawl and the engaging recessed portion restricts movement of the terminal module along the first direction relative to the connector case and retains the terminal module to the connector case.

4. The connector module of claim 1, wherein:
the terminal module includes an inner seal member formed as a toric member having an outer circumferential portion on a radial outer side thereof placed in pressure-contact with an inner circumferential face of the conductive shell and an inner circumferential portion on the radial inner side thereof placed in pressure-contact with the center conductor, thus sealing the inside of the terminal module;
the conductive shell includes an annular extending portion that extends annually from its inner circumferential face; and
the inner seal member has one face thereof with respect to the first direction retained by the annular extending portion and the other face thereof with respect to the first direction retained by an end face of the insulator holder with respect to the first direction, whereby the inner seal member is set in position in the terminal module.

5. The connector module of claim 4, wherein:
the terminal module includes a retaining ring formed as a toric member having an outer circumferential portion on the radial outer side thereof placed in contact with the inner circumferential face of the conductive shell and an inner circumferential portion on the radial inner side thereof which has an inside diameter sized at least to allow extension therethrough of the center conductor; and
the inner seal member and the insulator holder are disposed at a predetermined position with each other along the first direction as being bound between the annular extending portion and the retaining ring.

6. The connector module of claim 1, wherein:
the connector module includes an outer seal member formed as a toric member sealing the cylindrical space with an outer circumferential portion on a radial outer side thereof placed in pressure-contact with an inner circumferential face of the connector case which face forms the cylindrical space and an inner circumferential portion on the radial inner side thereof placed in pressure-contact with an outer circumferential face of the conductive shell; and
the outer seal member is disposed on the side of the shield case with respect to the first direction.

7. The connector module of claim 1, wherein the connector module has a predetermined characteristic impedance which is set based on an outside diameter of the center conductor, an inside diameter of the conductive shell and a relative dielectric constant of the insulator holder.

8. A vehicle-mounted camera comprising:
a camera module including;
   an image pickup device,
   an electronic circuit configured to drive and control the image pickup device and also to process a video signal outputted from the image pickup device, and
   an optical unit having a lens for condensing light onto the image pickup device;
the connector module of claim 1;
the center conductor being electrically connected to the electronic circuit; and
at least a part of the electronic circuit being shielded by the shield case.

* * * * *